(12) United States Patent
Nahar et al.

(10) Patent No.: US 10,886,130 B2
(45) Date of Patent: Jan. 5, 2021

(54) METHODS OF FORMING CRYSTALLINE SEMICONDUCTOR MATERIAL, AND METHODS OF FORMING TRANSISTORS

(71) Applicant: Micron Technology, Inc., Boise, ID (US)

(72) Inventors: Manuj Nahar, Boise, ID (US); Darwin Franseda Fan, Boise, ID (US); Junting Liu-Norrod, Boise, ID (US); Michael Mutch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/112,410

(22) Filed: Aug. 24, 2018

(65) Prior Publication Data

US 2020/0066513 A1 Feb. 27, 2020

(51) Int. Cl.
*H01L 21/76* (2006.01)
*H01L 21/20* (2006.01)
(Continued)

(52) U.S. Cl.
CPC .......... *H01L 21/2022* (2013.01); *C23C 16/06* (2013.01); *C23C 16/24* (2013.01); *C23C 16/56* (2013.01); *H01L 21/0245* (2013.01); *H01L 21/0262* (2013.01); *H01L 21/0265* (2013.01); *H01L 21/02422* (2013.01); *H01L 21/02513* (2013.01); *H01L 21/02532* (2013.01);
(Continued)

(58) Field of Classification Search
CPC ......... H01L 21/02513; H01L 21/02532; H01L 21/02661; H01L 21/30604; H01L 21/02592; H01L 21/02636; H01L 27/10805; H01L 21/0262; H01L 21/02595; H01L 21/0265; H01L 21/02667; H01L 29/7827; H01L 29/29; H01L 29/66666; H01L 21/0245; H01L 21/02422; H01L 21/2022; H01L 27/2454
See application file for complete search history.

(56) References Cited

U.S. PATENT DOCUMENTS

5,318,919 A * 6/1994 Noguchi ............. H01L 21/2022
438/166
7,030,313 B2 * 4/2006 Inamasu ............. H01L 31/0392
136/249
(Continued)

*Primary Examiner* — Shouxiang Hu
(74) *Attorney, Agent, or Firm* — Wells St. John P.S.

(57) ABSTRACT

Some embodiments include a method of forming crystalline semiconductor material. A template is provided to have a polycrystalline region along a surface. Semiconductor material is deposited along the surface under conditions which grow crystalline semiconductor structures from grains of the polycrystalline region. The deposition is conducted at a temperature of less than or equal to 500° C. Some embodiments include a method of forming a transistor. A template is provided to have a polycrystalline region along a surface. Semiconductor material is deposited along the surface under conditions which grow crystalline semiconductor structures from grains of the polycrystalline region. The semiconductor material includes germanium. The crystalline semiconductor structures are doped to form a configuration having a first portion over a second portion. Insulative material is formed adjacent the second portion. A transistor gate is formed along the insulative material.

47 Claims, 8 Drawing Sheets

(51) Int. Cl.
  *H01L 21/02* (2006.01)
  *C23C 16/56* (2006.01)
  *H01L 21/306* (2006.01)
  *H01L 29/66* (2006.01)
  *H01L 29/78* (2006.01)
  *H01L 27/108* (2006.01)
  *C23C 16/24* (2006.01)
  *C23C 16/06* (2006.01)
  *H01L 27/24* (2006.01)

(52) U.S. Cl.
  CPC .. *H01L 21/02592* (2013.01); *H01L 21/02595* (2013.01); *H01L 21/02636* (2013.01); *H01L 21/02661* (2013.01); *H01L 21/02667* (2013.01); *H01L 21/30604* (2013.01); *H01L 27/10805* (2013.01); *H01L 27/2454* (2013.01); *H01L 29/66666* (2013.01); *H01L 29/7827* (2013.01)

(56) References Cited

U.S. PATENT DOCUMENTS

| | | | |
|---|---|---|---|
| 8,053,776 B2* | 11/2011 | Ohashi | G11C 13/0007 257/64 |
| 2003/0146469 A1* | 8/2003 | Matsuoka | H01L 27/2454 257/328 |
| 2012/0119283 A1* | 5/2012 | Lee | H01L 27/11519 257/316 |
| 2013/0207067 A1* | 8/2013 | Pan | H01L 29/7827 257/4 |

* cited by examiner

METHODS OF FORMING CRYSTALLINE SEMICONDUCTOR MATERIAL, AND METHODS OF FORMING TRANSISTORS

TECHNICAL FIELD

Methods of forming crystalline semiconductor material, and methods of forming transistors.

BACKGROUND

Transistors may be utilized in numerous applications; such as, for example, dynamic random-access memory (DRAM), resistive RAM (RRAM), magnetic RAM (MRAM), spin-transfer-torque-MRAM (STT-MRAM), etc.

A field-effect transistor (FET) comprises an active region. The active region includes a gated channel region between a pair of source/drain regions.

A continuing goal of semiconductor fabrication is to increase the density of integration. It is therefore desired to develop improved FET architectures which are suitable for utilization in highly-integrated architectures, and to develop methods for fabricating such FET architectures.

Vertical transistors are transistors in which a channel region extends vertically between source/drain regions. Vertical transistors may be utilized as access devices in highly-integrated memory architectures.

It is desirable to include crystalline semiconductor materials within transistor active regions. Crystalline semiconductor materials may be readily formed with thermal processing utilizing temperatures in excess of 600° C. However, transistors may be formed after other integrated components. Such other integrated components may be adversely impacted by the high temperatures utilized to form the crystalline semiconductor materials. Accordingly, it would be desirable to develop new methods for fabricating crystalline semiconductor materials at lower temperatures.

DETAILED DESCRIPTION OF THE ILLUSTRATED EMBODIMENTS

Some embodiments include methods suitable to form crystalline semiconductor materials at temperatures of less than or equal to about 500° C. The crystalline semiconductor materials may be incorporated into transistor active regions, or may be utilized in any other suitable applications. Example methods are described below with reference to FIGS. 1-8.

Figure 1:
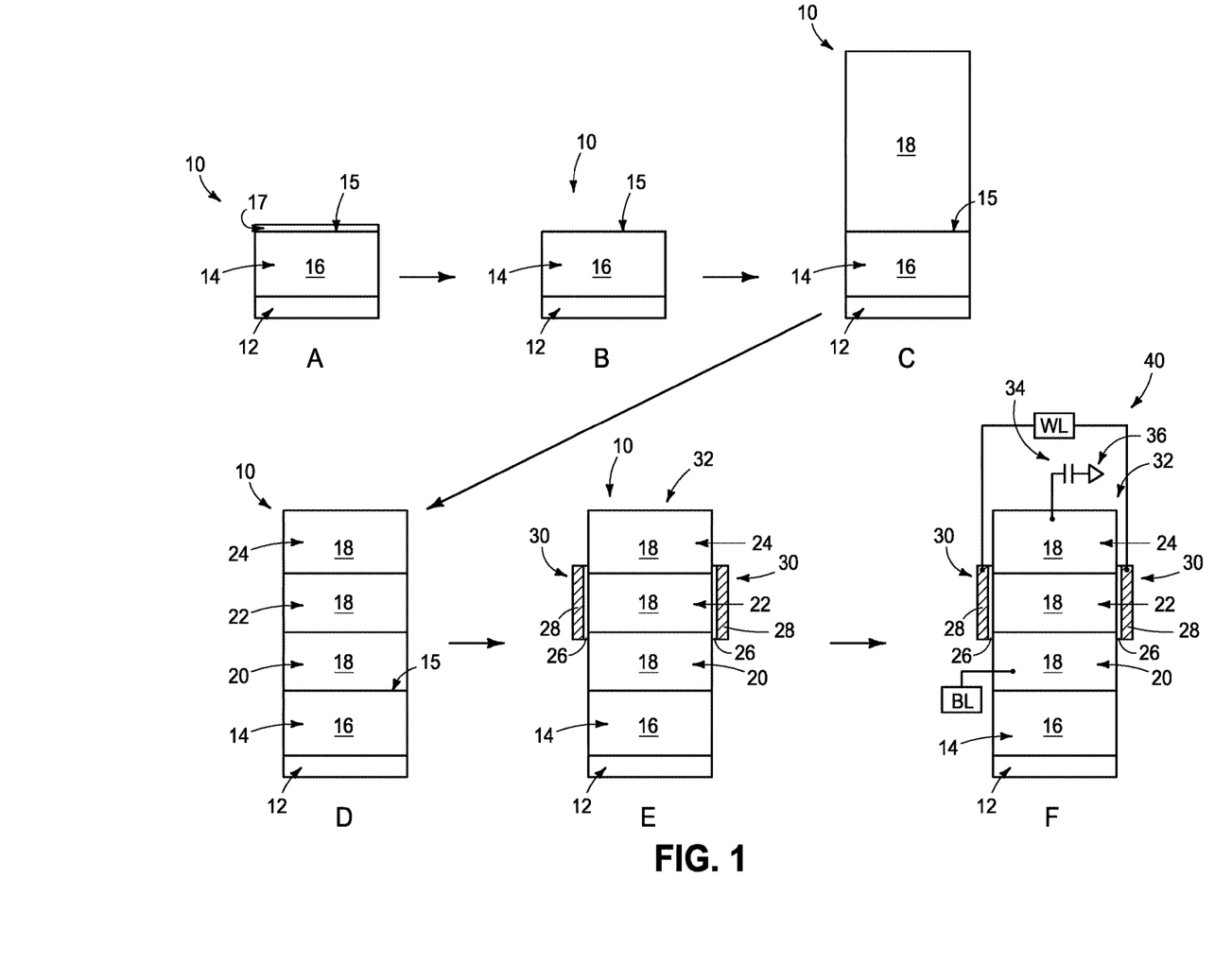
FIG. 1 shows diagrammatic cross-sectional views of an example structure at example process stages of an example method.

Referring to FIG. 1, a portion of a construction 10 includes a template 14 supported by a base 12. The construction 10 is shown at a process stage "A" at the top left of FIG. 1.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

The template 14 may be over and directly against any suitable material of the base 12; and in some applications may be over and directly against a semiconductor material of the base 12, an insulative material of the base 12, or a conductive material of the base 12. The template 14 may comprise crystalline material formed with any suitable method (e.g., deposition followed by an appropriate anneal, growth utilizing solid phase epitaxy, etc.).

The template 14 comprises a surface 15 having polycrystalline material utilized as a seed for growing crystalline semiconductor structures. In some embodiments, the polycrystalline material may extend throughout the template (as described in more detail below with reference to an embodiment of FIG. 6), and in other embodiments the polycrystalline material may be primarily within regions along a surface of the template (as described in more detail below with reference to embodiments of FIGS. 4 and 5). The template 14 may comprise any suitable composition(s). In some embodiments, the template comprises semiconductor material 16; and such semiconductor material may comprise, consist essentially of, or consist of one or both of silicon and germanium.

The polycrystalline material of the template is preferably formed at relatively-low temperature in order to avoid or eliminate the problems described above in the "Background" section (e.g., in order to avoid or eliminate problems of thermally degrading integrated circuitry which may be associated with the base 12). The term "relatively-low temperature" refers to a temperature below the 600° C. temperature associated with conventional processes. In some embodiments, the polycrystalline material of the template 14 may be formed at a temperature of less than or equal to about 550° C. The temperature may be a temperature of the as-deposited polycrystalline material; and may further be a temperature of a chuck retaining a structure comprising the polycrystalline material, a temperature of an ambient within a chamber during the formation of the polycrystalline material, etc.

The polycrystalline material of the template 14 may have any suitable grain size, and in some embodiments may have an average grain size within a range of from about 5 nanometers (nm) to about 5 microns; such as, for example, an average grain size within a range of from about 5 nm to about 10 nm; an average grain size within a range of from about 1 micron to about 5 microns; etc. Such average grain sizes may be determined utilizing any suitable methods; with appropriate methods being readily recognized by persons of ordinary skill.

If the template 14 comprises silicon in the absence of germanium, it may be desirable for the template 14 to be heavily-doped (i.e., to be doped to a concentration of at least about $10^{21}$ atoms/cm$^3$ with conductivity-enhancing dopant) so that the polycrystalline material of the template may be formed at the desired low temperature. The conductivity-enhancing dopant may be n-type (e.g., phosphorus) or p-type (e.g., boron).

If the template 14 comprises germanium in addition to silicon (e.g., comprises SiGe, with the formula indicating primary constituents rather than a specific stoichiometry), then the relative amount of germanium may be chosen to tailor the temperature for fabrication of the polycrystalline material of the template. Specifically, higher germanium concentrations will enable lower temperatures to be utilized for formation of polycrystalline material within the template. In some embodiments, the germanium concentration within the SiGe-comprising template may be within a range of from about 5 atomic percent (at %) to about 95 at %; within a range of from about 10 at % to about 90 at %; within a range of from about 5 at % to about 50 at %, etc. In some embodiments, the relative amount of germanium within the SiGe-comprising template may be such that the polycrystalline material of the template may be formed a temperature of less than or equal to about 500° C. The SiGe-comprising template may be heavily-doped in some embodiments, and may not be heavily-doped in other embodiments. Including dopant (e.g., phosphorus) in the SiGe may further decrease a crystallization temperature as compared to the SiGe without the dopant.

In some embodiments, it may be desirable for the template 14 to comprise germanium in the absence of silicon. Accordingly, in some embodiments the semiconductor material of the template 14 may consist essentially of, or consist of germanium. Such semiconductor material may be heavily-doped in some embodiments, and in other embodiments may not be heavily-doped.

A layer 17 of oxide is over the surface 15. The layer 17 may comprise, consist essentially of, or consist of one or both of silicon oxide and germanium oxide; and may form if surface 15 is exposed to air or some other source of oxygen. In some embodiments, the template 14 may be formed under conditions such that the surface 15 is never exposed to a source of oxygen, and accordingly the layer 17 may never be formed. However, to the extent that the layer 17 may form, it is desirable to remove such layer and thereby expose the surface 15 of the template 14. Accordingly, construction 10 is exposed to processing which removes the layer 17. Such processing transitions the construction 10 from the process stage "A" to a process stage "B". The processing utilized to remove the layer 17 may be any suitable processing; including, for example, an etch utilizing fluorine-containing etchant (e.g., hydrofluoric acid). The etch may correspond to a wet clean, a gaseous clean, etc.

After the surface 15 is exposed, semiconductor material 18 is deposited along the surface 15 under conditions which grow crystalline semiconductor structures from grains of the polycrystalline material along the surface 15. Such processing transitions the construction 10 from the process stage "B" to a process stage "C". The removal of the layer 17 may be conducted within the same chamber utilized for the deposition, or within a different chamber.

The semiconductor material 18 may be referred to as a second semiconductor material to distinguish it from the first semiconductor material 16.

The second semiconductor material 18 is formed under conditions having a temperature of less than or equal to about 500° C., and has a polycrystalline structure extending therethrough. The polycrystalline structure within the semiconductor material 18 results from the propagation of crystalline properties from the grains along the surface 15 into the semiconductor material 18 during the deposition of the semiconductor material 18.

The low temperature utilized to form the polycrystalline semiconductor material 18 may avoid or eliminate the problems described in the "Background" section (e.g., may avoid or eliminate problems of thermally degrading integrated circuitry which may be associated with the base 12).

The polycrystalline semiconductor material 18 may comprise any suitable composition(s); and in some embodiments may comprise, consist essentially of, or consist of one or both of silicon and germanium. If the semiconductor material 18 comprises both silicon and germanium, the germanium concentration may be within a range of from about 5 at % to about 95 at %; and in some embodiments may be within a range of from about 10 at % to about 90 at %.

The deposition of the polycrystalline semiconductor material 18 may utilize any suitable method; and in some embodiments may utilize one or more of atomic layer deposition (ALD), chemical vapor deposition (CVD), plasma-enhanced chemical vapor deposition (PECVD), physical vapor deposition (PVD), and molecular beam epitaxy (MBE). For instance, in some example embodiments the deposition of the polycrystalline semiconductor material 18 may utilize CVD with one or both of a silicon precursor and a germanium precursor; a temperature within a range of from about 250° C. to about 500° C., and a pressure within a range of from about 1 Torr to about 1 atmosphere. The CVD may be plasma-enhanced in some embodiments. The plasma may or may not be remote relative to the deposited material 18. The temperature may be a temperature of the as-deposited material 18; and may further be a temperature of a chuck retaining a structure comprising the material 18, a temperature of an ambient within a chamber during the formation of the material 18, etc.

The precursors utilized for the CVD may be any suitable precursors. For instance, if the CVD utilizes silicon precursor, such may include one or more of SiH, SiX and SiXH; where X represents halogen, and where the formulas indicate primary constituents rather than indicating specific stoichiometries. Example silicon precursors are monosilane, disilane, trisilane, neopentasilane and dichlorosilane. If the CVD utilizes germanium precursor, such may include one or more of GeH, GeX and GeXH; where X represents halogen, and where the formulas indicate primary constituents rather than indicating specific stoichiometries. Example germanium precursors are germane and digermane.

The polycrystalline semiconductor material 18 may be fully polycrystalline throughout the entirety of its thickness; or may be only partially polycrystalline. In some embodiments, the crystallinity within the semiconductor material 18 will be at least about 5% (by volume), at least about 50% (by volume), at least about 75% (by volume) etc. The overall crystallinity within the polycrystalline semiconductor material 18 may be tailored for specific applications. In some embodiments, the overall crystallinity will be within a range of from at least about 5% (by volume) to about 100% (by volume).

In some embodiments, material 18 may be considered to correspond to a mass having one or more polycrystalline regions, and possibly also having one or more non-polycrystalline regions (e.g., amorphous region, voids, etc.). For instance, in some embodiments a polycrystalline region of material 18 may extend entirely across the surface 15 (as described in more detail below with reference to an embodiment of FIG. 6). As another example, in some embodiments there may be multiple polycrystalline regions of material 18 along the surface 15, with such regions being spaced from one another by intervening regions which are not polycrystalline (as described in more detail below with reference to embodiments of FIGS. 4 and 5).

The polycrystalline semiconductor material 18 may be appropriately-doped to form desired portions (regions) of a desired device. For instance, the processing stage "D" of FIG. 1 shows construction 10 after the polycrystalline semiconductor material 18 is doped to form a first portion 20, a second portion 22 and a third portion 24. The first and third portions 20 and 24 may be heavily-doped with conductivity-enhancing dopant, and may correspond to source/drain regions. The portion 22 may comprise a dopant concentration of less than $10^{18}$ atoms/cm$^3$, and may correspond to a channel region. Dopant may be provided within the channel region 22, or the channel region 22 may be left relatively undoped (e.g., may be intrinsically doped). The portions 20, 22 and 24 may be formed by providing dopant in situ during the formation of semiconductor material 18 (i.e., there may not be a processing stage "C" of FIG. 1, but instead the processing may proceed directly from the processing stage "B" to the processing stage "D"). Alternatively, one or more of the portions 20, 22 and 24 may be formed by implanting dopant into such portion subsequent to the formation of the polycrystalline semiconductor material 18.

The source/drain regions 20 and 24 may be n-type doped in some embodiments, and may be p-type doped in other embodiments. The channel region 22 may comprise an opposite conductivity-type dopant relative to the source/drain regions 20 and 24 (e.g., the channel region 22 may be p-type in embodiments in which the source/drain regions 20 and 24 are n-type); or the channel region 22 may be effectively undoped (e.g., may comprise intrinsic level doping).

In some embodiments, the doped polycrystalline semiconductor material 18 at the process stage "D" of FIG. 1 may be considered to be in a configuration having a first portion 24 over a second portion 22, with the second portion being less heavily doped than the first portion. The shown configuration of the polycrystalline semiconductor material 18 further comprises a third portion 20 under the second portion 22, with the third portion 20 being more heavily doped than the second portion 22. In some embodiments, the first and third portions 24 and 22 may comprise about the same level of doping as one another (with the term "about the same" meaning the same to within reasonable tolerances of fabrication and measurement), and may comprise a same dopant as one another.

The deposition temperature utilized to form the polycrystalline semiconductor material 18 may be decreased by increasing the relative concentration of germanium within the semiconductor material (as compared to the concentration of silicon) and/or by increasing a concentration of dopant (e.g., n-type dopant, p-type dopant, neutral dopant, etc.) within the semiconductor material. In some embodiments, one of the portions 20, 22 and 24 may have a different germanium concentration relative to another of the portions, and the deposition temperature may vary in proceeding from said one of the portions to said other of the portions due to the change in germanium concentration. In some embodiments, one or more of the portions 20, 22 and 24 may be in situ doped during its formation. The deposition temperature may vary in transitioning from one of the portions 20, 22 and 24 to another due to a change in the dopant concentration provided during the deposition. In some embodiments, the germanium concentration within the portions 20, 22 and 24 and/or the in-situ dopant concentration provided during formation of the portions 20, 22 and 24 may be tailored to achieve a desired low-temperature deposition while also maintaining desired properties of the portions suitable for utilization in a final device.

In some embodiments, one of the portions 20, 22 and 24 may have a different amount of crystallinity relative to another of the portions (e.g., may have a different average grain size, a different distribution of grain sizes, a different overall amount of crystalline structure relative to non-crystalline structure, etc.); and in other embodiments all of the portions may have about the same amount of crystallinity as one another (with the term "about the same" meaning the same to within reasonable tolerances of fabrication and measurement).

Although the device of FIG. 1 comprises three portions 20, 22 and 24 within the semiconductor material 18, it is to be understood that other devices may comprise more than three portions or fewer than three portions.

The processing stage "E" of FIG. 1 shows insulative material 26 formed adjacent the doped region 22, and shows conductive material 28 formed adjacent the insulative material 26.

The insulative material 26 may comprise any suitable composition(s), and in some embodiments may comprise, consist essentially of, or consist of silicon oxide.

The conductive material 28 may comprise any suitable composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive material 28 forms a transistor gate 30 along the region 22, with such transistor gate being spaced from the region 22 by the intervening insulative material 26 (which may be referred to as gate dielectric material). A transistor 32 comprises the transistor gate 30, together with the channel region 22, the source/drain region 20, and the source/drain region 24.

The transistor 32 is a vertical transistor in that an active region of such transistor extends vertically from the base 12; with the active region being understood to comprise the illustrated regions 20, 22 and 24.

The transistor 32 may be utilized in a memory array. For instance, the process stage "F" shows the transistor 32 incorporated into a memory cell 40. The transistor gate 30 is coupled with a wordline WL, the source/drain region 20 is coupled with a bitline BL, and the source/drain region 24 is coupled with a capacitor 34. The capacitor has a node coupled with a reference voltage 36. Such reference voltage may correspond to ground, or to any other suitable voltage.

The memory cell 40 may be representative of a large number of substantially identical memory cells formed across a memory array; with the term "substantially identical" meaning identical to within reasonable tolerances of fabrication and measurement.

Figure 2:
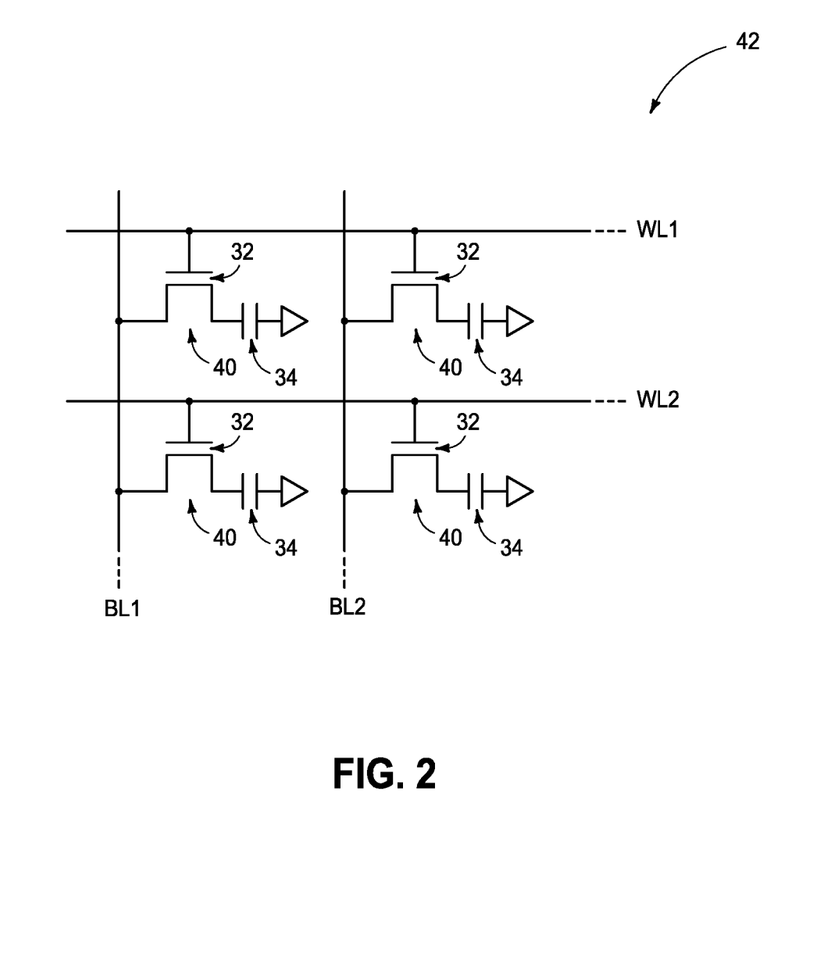
FIG. 2 shows a schematic view of a region of an example memory array.

An example memory array 42 is described with reference to FIG. 2. The memory array comprises a plurality of wordlines (represented by the wordlines WL1 and WL2) extending along rows of the array, and comprises a plurality of bitlines (represented by the bitlines BL1 and BL1) extending along columns of the array. The memory array comprises a plurality of substantially identical memory cells 40; with each of the memory cells comprising a transistor 32 in combination with a capacitor 34.

In some embodiments, it may be desired to anneal the polycrystalline semiconductor material 18 after deposition of such material. The anneal may be conducted at any suitable temperature for any suitable duration. In some embodiments, it is desired that the temperature of the anneal be lower than the problematic temperatures of the conventional processing described above in the "Background" section (i.e., lower than about 600° C.). In some embodiments, the anneal may utilize a temperature higher than the deposition temperature and lower than about 550° C. In some embodiments, such anneal may be conducted for a duration of at least about one second. In some embodiments, the duration of the anneal may be less than or equal to about 10 hours. The temperature may be a temperature of the material 18 during the anneal; and may further be a temperature of a chuck retaining a structure comprising the material 18 during the anneal, a temperature of an ambient within a chamber during the anneal, etc.

Figure 3:
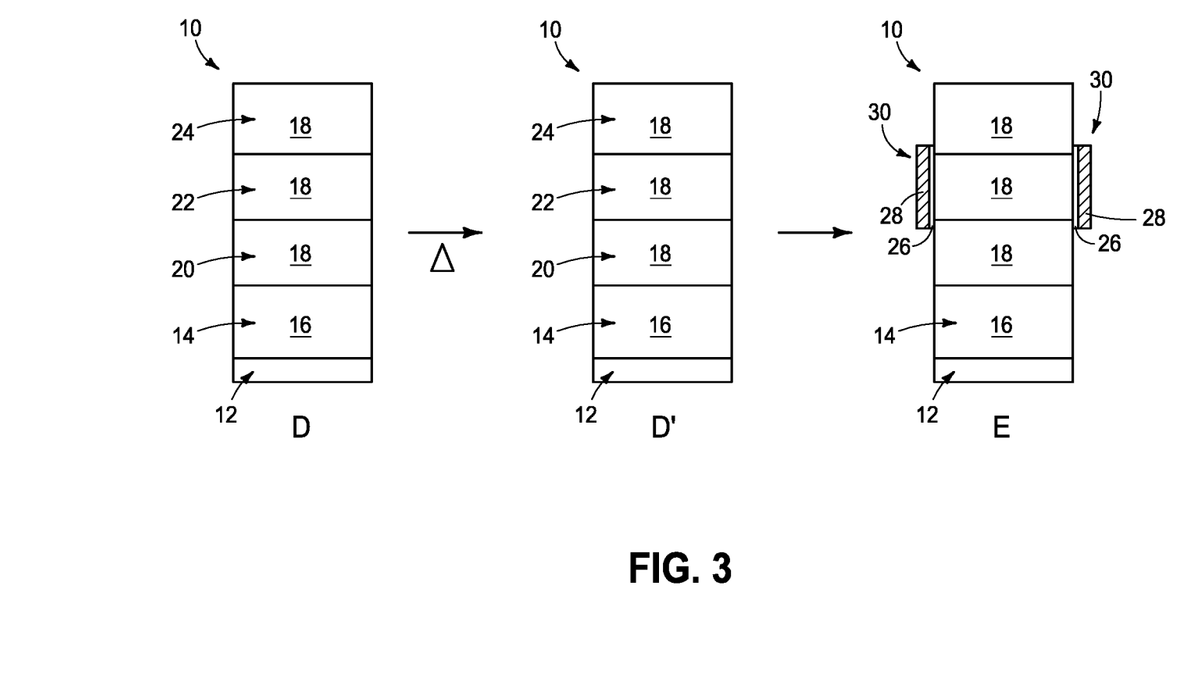
FIG. 3 shows diagrammatic cross-sectional views of an example structure at example process stages of an example method.

FIG. 3 shows the construction 10 at the process stage "D" of FIG. 1, and shows such construction subjected to an optional anneal to transition the construction to a process stage D' (with the thermal processing of the anneal being represented by A). The anneal may utilize any suitable methodology, including, for example, a laser anneal, a microwave anneal, etc. The anneal may advantageously cure defects within the semiconductor material 18, activate dopant, transform amorphous regions into polycrystalline regions, etc. In some embodiments, the anneal may increase crystallinity within the semiconductor material 18. Following the anneal, construction 10 is transitioned to the process stage E described above with reference to FIG. 1.

Figure 4:
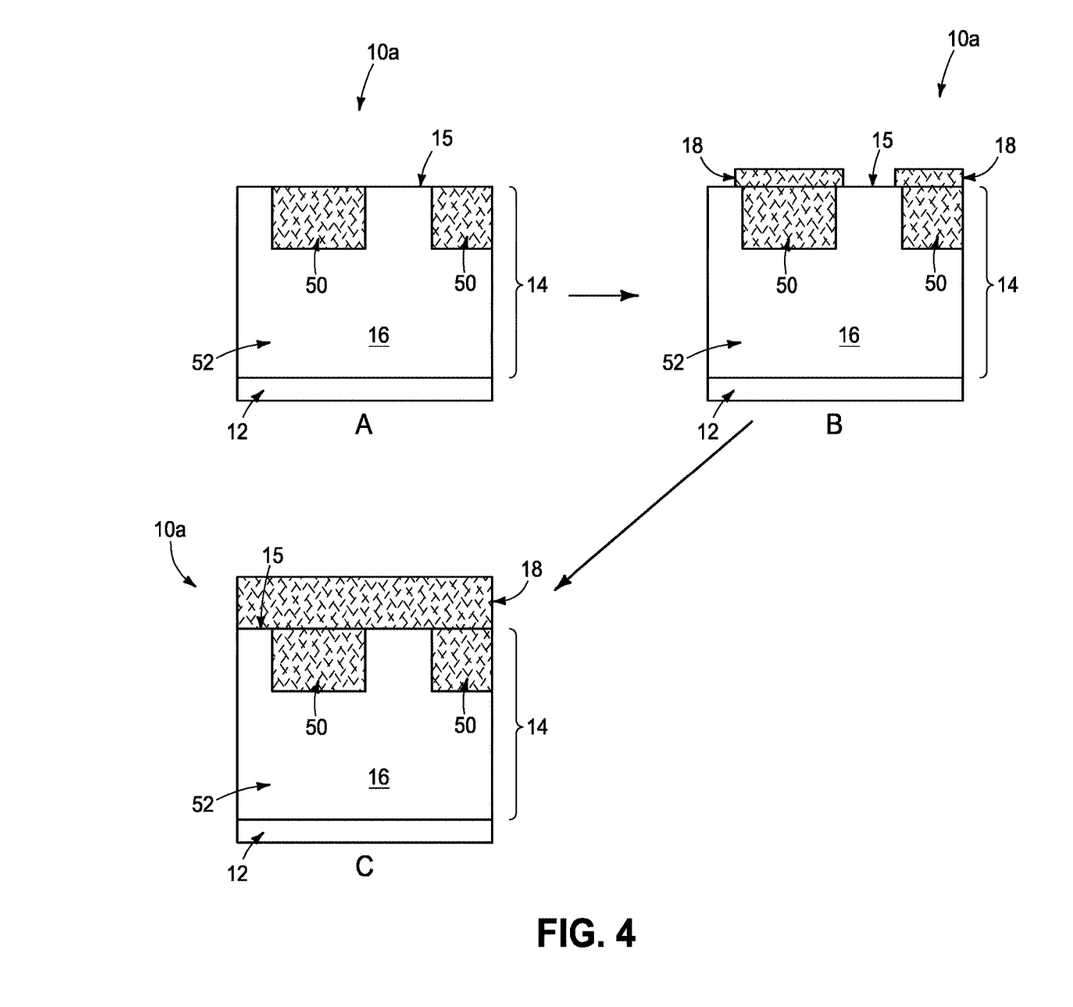
FIG. 4 shows diagrammatic cross-sectional views of an example structure at example process stages of an example method.

In some embodiments, the template 14 may comprise polycrystalline regions and non-polycrystalline regions; and the deposition of the polycrystalline semiconductor material 18 may comprise selective growth of such material from the polycrystalline regions of the template. For instance, FIG. 4 shows a construction 10a at an initial process step A, with such construction comprising a template 14 having polycrystalline regions 50 and a non-polycrystalline region 52. Crystalline structures within the polycrystalline regions 50 are diagrammatically illustrated utilizing lines within the regions 50.

The regions 50 and 52 may comprise a same composition as one another, or may comprise different compositions relative to one another. In some embodiments, the regions 50 and 52 may both comprise the same semiconductor material 16 (e.g., Si, Ge, SiGe, etc.). The region 52 may correspond to amorphous portions of the semiconductor material, may comprise voids, etc. Although the regions 50 are shown to be only along the upper portion of the template, in other embodiments the regions 50 may extend entirely through a thickness of the template.

The template 14 comprises the upper surface 15. Some portions of the upper surface are along the polycrystalline regions 50, and other portions are along the non-polycrystalline region 52. It may be desired that at least about 5% of the area of the surface 15 be polycrystalline; and in some embodiments it may be desired at least about 50% of the area of the surface 15 be polycrystalline. In some example embodiments, it may be desired that substantially all of the area of surface 15 be polycrystalline; and that the only non-polycrystalline regions along the surface 15 be minor defects.

The deposition of the semiconductor material 18 is conducted under conditions which enable the crystalline structure of crystalline regions 50 to propagate through the material 18. Accordingly, crystalline semiconductor structures grow throughout the semiconductor material 18 as the material is deposited, with such crystalline semiconductor structures being propagated from the crystalline grains of the polycrystalline regions 50. The polycrystalline properties of semiconductor material 18 are diagrammatically illustrated with lines provided within the material 18.

The conditions utilized for depositing the semiconductor material 18 may selectively grow the polycrystalline material 18 over regions 50 faster than any growth of non-crystalline material 18 over the non-polycrystalline region 52, as shown at the process stage B of FIG. 4. Further, the growing polycrystalline semiconductor material 18 may extend laterally as well as vertically (as shown at the process stage B) so that the polycrystalline semiconductor material 18 eventually covers the non-polycrystalline region 52. In some embodiments, the processing of FIG. 4 may utilize a CVD process of the type described above relative to FIG. 1.

The process stage C of FIG. 4 shows the polycrystalline semiconductor material 18 eventually completely covering the entirety of the surface 15. Ultimately, the polycrystalline semiconductor material 18 may be doped and incorporated into a semiconductor device utilizing any of the methodologies described above relative to FIG. 1. The polycrystalline semiconductor material 18 of FIG. 4 may comprise any suitable amount of crystallinity within its volume; with example suitable amounts of crystallinity being discussed above with reference to FIG. 1.

FIG. 4 describes an embodiment in which there is effectively no growth of non-polycrystalline material over the non-polycrystalline regions 52. However, in some embodiments there may be some growth of the non-polycrystalline material over the non-polycrystalline regions as described with reference to FIG. 5.

Figure 5:
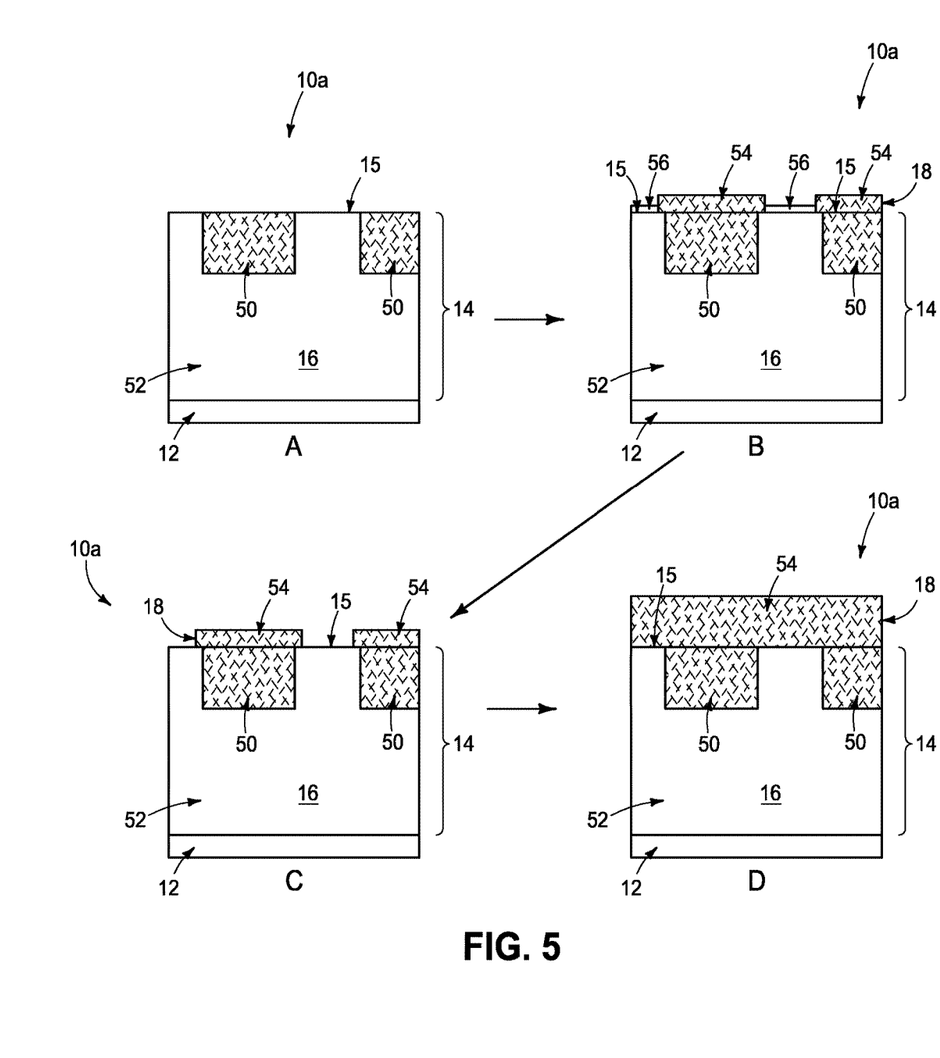
FIG. 5 shows diagrammatic cross-sectional views of an example structure at example process stages of an example method.

A first process stage A of FIG. 5 shows the construction 10a described above with reference to the first process stage A of FIG. 4.

A second process stage B of FIG. 5 shows the semiconductor material 18 deposited over the upper surface 15 of the template 14. The semiconductor material 18 comprises polycrystalline regions 54 which are forming over the polycrystalline regions 50 of the template 14, and comprises non-polycrystalline regions 56 which are forming over the non-polycrystalline region 52 of the template 14. The polycrystalline regions 54 are forming faster than the non-polycrystalline regions 56, and accordingly are thicker than the non-polycrystalline regions 56 and extend laterally beyond edges of the polycrystalline regions 50 of the template 14.

The non-polycrystalline regions 56 may undesirably interfere with the quality of the semiconductor material 18 if left unchecked. Accordingly, etchant is introduced into the deposition chamber to remove the non-polycrystalline regions 56. Such etchant may also remove some of the polycrystalline regions 54, but such will not be problematic provided that the polycrystalline regions 54 grow faster than any removal by the etchant. The etchant may be provided during the deposition (i.e., while deposition precursors are within the reaction chamber), or may be provided during a break in a deposition process (i.e., while deposition precursors are absent from the reaction chamber). The etchant may comprise any suitable composition(s); and in some embodiments may comprise halogen (e.g., Cl, HCl, $Cl_2$, etc.). In some embodiments, the etchant may be a byproduct formed from deposition precursor as the precursor breaks down to form the semiconductor material 18. For instance, in some embodiments the semiconductor material 18 may comprise silicon deposited utilizing dichlorosilane as a precursor in a CVD process (e.g., the CVD process described above with reference to FIG. 1), and the etchant may comprise chlorine formed as a byproduct during the deposition process.

The process stage C of FIG. 5 shows the non-polycrystalline regions 56 of material 18 removed by the etchant, and the process stage D of FIG. 5 shows the polycrystalline semiconductor material 18 eventually covering an entirety of the surface 15 of the template 14. The polycrystalline semiconductor material 18 of FIG. 5 may comprise any suitable amount of crystallinity within its volume; with example suitable amounts of crystallinity being discussed above with reference to FIG. 1. In some embodiments, voids may be present between the material 18 and the surface 15 along the non-polycrystalline regions 56. The voids may be removed during patterning of a vertical fin of material 18; such as, for example, during patterning to form a vertically-extending transistor analogous to the transistor 36 shown at the process stage D of FIG. 6 and described below.

Figure 6:
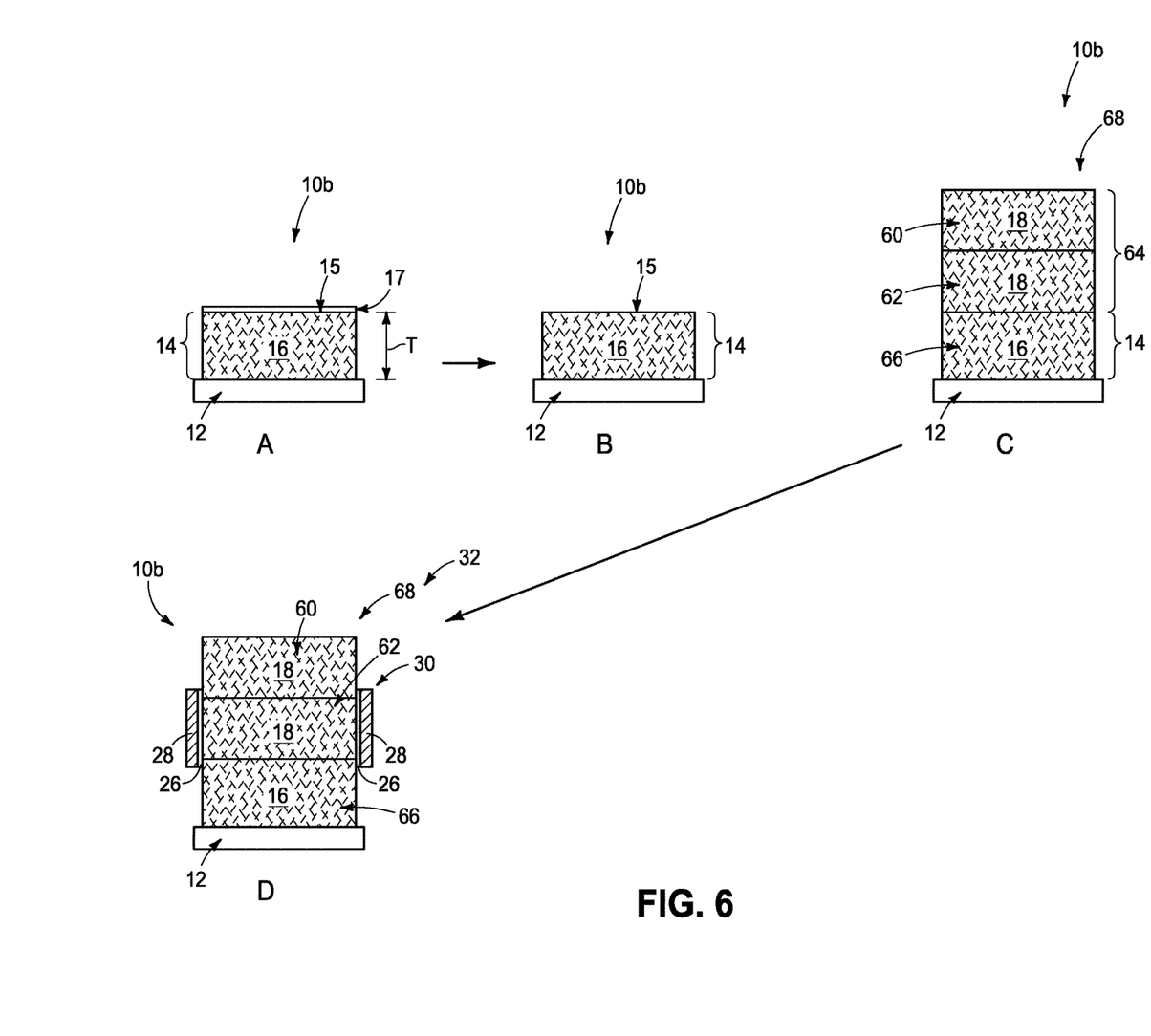
FIG. 6 shows diagrammatic cross-sectional views of an example structure at example process stages of an example method.

In some embodiments, the template 14 may comprise polycrystalline material entirely through its thickness. For instance, FIG. 6 shows a construction 10b at a process stage A analogous to the process stage A of FIG. 1, with the semiconductor material 16 of the template 14 being uniformly polycrystalline throughout the entirety of its thickness T. The semiconductor material 16 may be appropriately doped to form a source/drain region of a transistor device. The thickness T may be any suitable thickness; and in some embodiments may be within a range of from about 10 angstroms (Å) to about 600 Å.

The oxide layer 17 is across the upper surface 15 of the semiconductor material 16. Such oxide layer may be removed with processing of the type described above with reference to FIG. 1 to thereby expose the upper surface 15. FIG. 6 shows a process stage B having the exposed upper surface 15 of semiconductor material 16.

The polycrystalline semiconductor material 18 may be formed over the template 16 utilizing processing of the type described above with reference to FIG. 1. The semiconductor material 18 may be doped to form a heavily-doped upper portion 60 over a portion 62. The portion 62 may be either undoped (i.e. intrinsically doped), or lightly doped (i.e., doped to less than or equal to $10^{18}$ atoms/$cm^3$ with conductivity enhancing dopant), in some embodiments. The portions 60 and 62 together form a configuration 64, with such configuration being over the template 14. In some embodiments, the semiconductor material 16 of the template 14 may be doped to form a lower portion 66 of a transistor active region 68. The transistor active region comprises the portions 60 and 66 which are appropriately-doped to form source/drain regions, and comprises the portion 62 which is appropriately-doped to form a channel region.

The transistor active region 68 may be incorporated into a transistor 32 as shown at the process stage D. Such transistor may be incorporated into a memory cell analogous to the memory cell 40 of FIG. 1, and may be utilized in a memory array analogous to the memory array 42 of FIG. 2.

The polycrystalline semiconductor material 18 of FIG. 6 may comprise any suitable amount of crystallinity within its volume; with example suitable amounts of crystallinity being discussed above with reference to FIG. 1.

Figure 7:
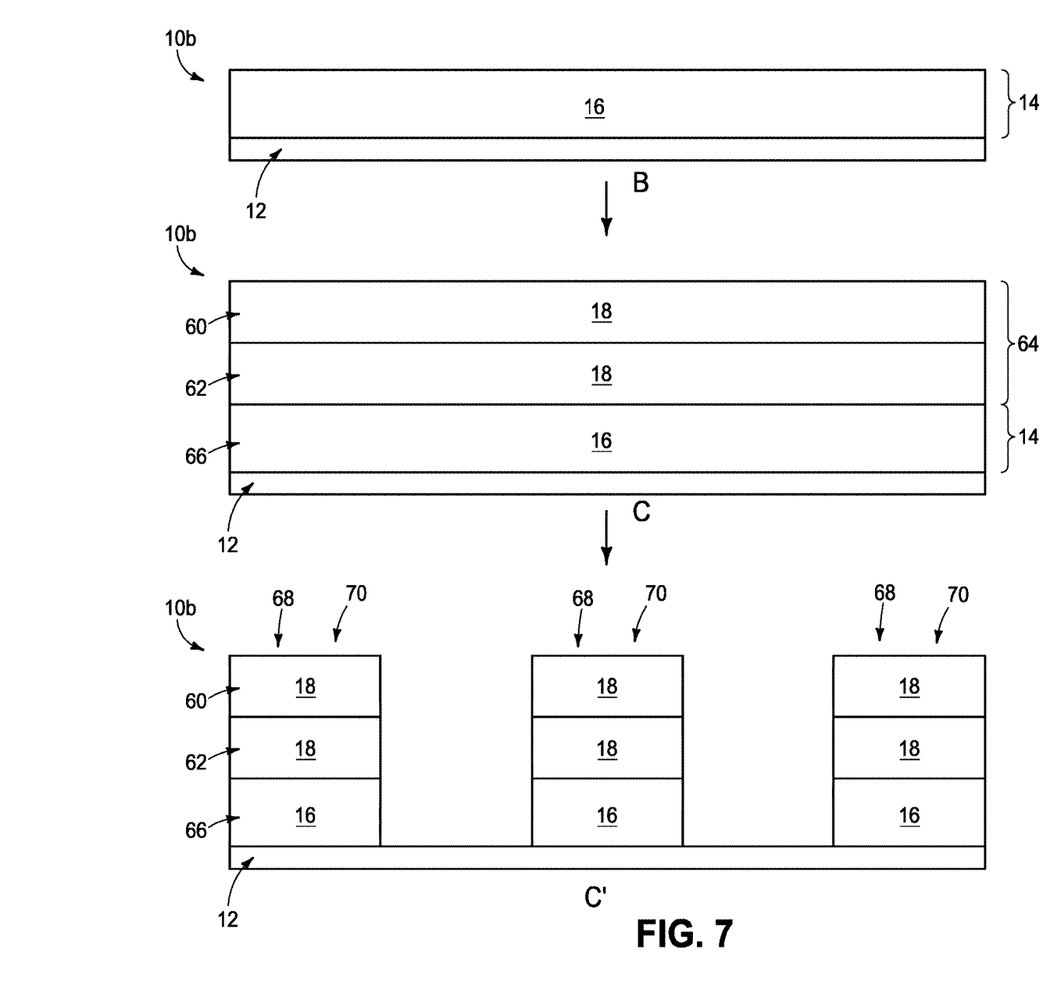
FIG. 7 shows diagrammatic cross-sectional views of an example structure at example process stages of an example method.

In some embodiments, the semiconductor material 16 of the above-described embodiments may be formed as an expanse, the semiconductor material 18 may be deposited over such expanse, and then the semiconductor material 18 may be patterned into desired structures. For instance, FIG. 7 shows the construction 10b of FIG. 6 in an embodiment in which the semiconductor material 16 of the template 14 is initially configured as a large expanse (the crystallinity is not shown in FIG. 7 in order to simplify the drawing). An uppermost process stage of FIG. 7 corresponds to the process stage B of FIG. 6. The next process stage of FIG. 7 is analogous to the process stage C of FIG. 6, and has the semiconductor material 18 deposited over the template 14; with the semiconductor material 18 comprising the configuration 64 having the first portion 60 over the second portion 62. The final process stage shown in FIG. 7 is a process stage C' in which the semiconductor materials 16 and 18 are patterned into structures 70 configured as transistor active regions 68, and suitable for incorporation into transistors 32 of the type shown in FIG. 6 at the process stage D.

Figure 8:
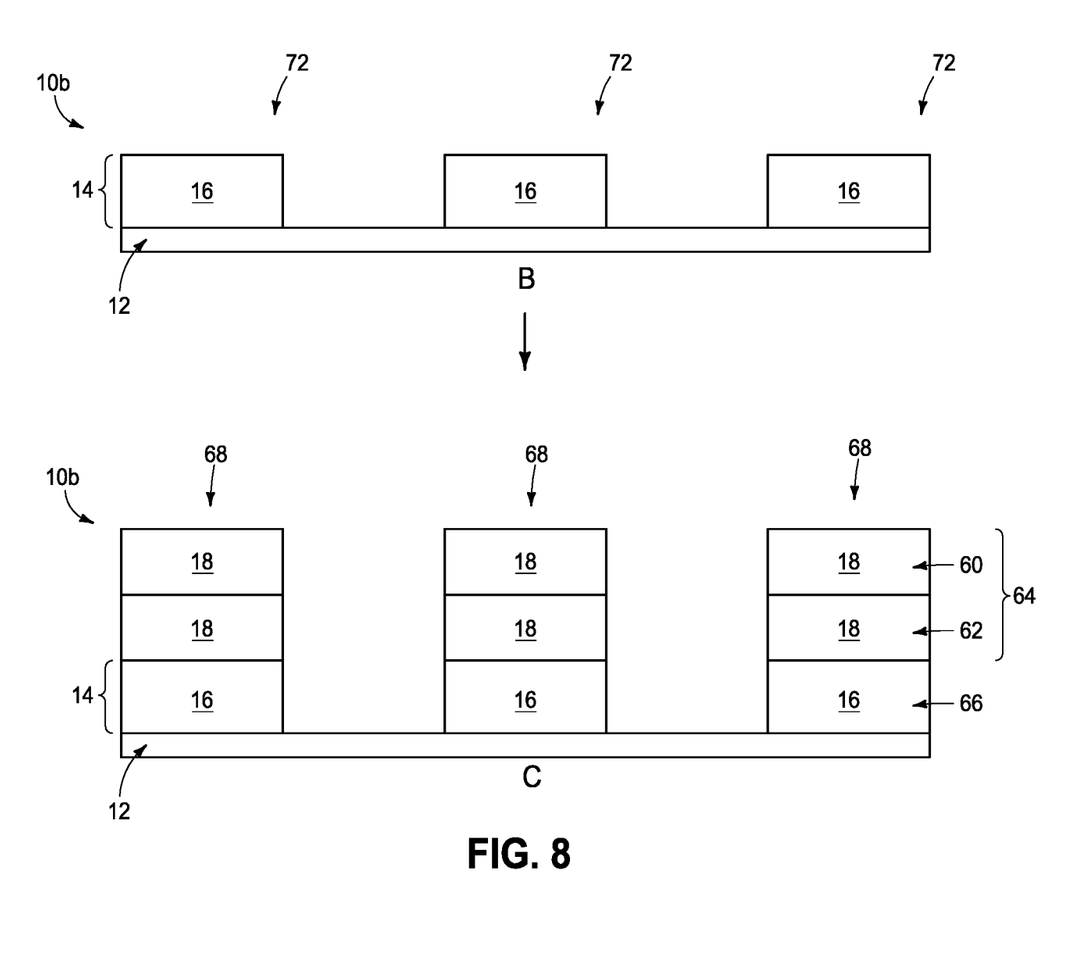
FIG. 8 shows diagrammatic cross-sectional views of an example structure at example process stages of an example method.

In some embodiments, the semiconductor material 16 of the above-described embodiments may be patterned into structures and then the semiconductor material 18 may be selectively deposited onto such patterned structures. For instance, FIG. 8 shows the construction 10b of FIG. 6 in an embodiment in which the semiconductor material of the template is patterned into structures (the crystallinity is not shown in FIG. 8 in order to simplify the drawing). An uppermost process stage of FIG. 8 corresponds to the process stage B of FIG. 6, and shows the semiconductor material 16 of the template 14 patterned into structures 72 supported by the base 12. The next process stage of FIG. 8 is analogous to the process stage C of FIG. 6, and has the semiconductor material 18 deposited over the template 14; with the semiconductor material 18 comprising the configuration 64 having the first portion 60 over the second portion 62. The semiconductor material 18 is selectively deposited onto the material 16 relative to the base 12. Accordingly, the semiconductor materials 16 and 18 are configured as transistor active regions 68, and are suitable for incorporation into transistors 32 of the type shown in FIG. 6 at the process stage D.

The crystalline semiconductor materials described herein may be utilized in any suitable applications. Also, the transistors described herein may be utilized in any suitable applications. Although the transistors are specifically shown being utilized in DRAM memory cells, it is to be understood that the transistors may be utilized in other applications; such as, for example, logic, sensors, and/or other memory besides the illustrated DRAM.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming crystalline semiconductor material. A template is provided to have a polycrystalline region along a surface. Semiconductor material is deposited along the surface under conditions which grow crystalline semiconductor structures from grains of the polycrystalline region. The deposition is conducted at a temperature of less than or equal to 500° C.

Some embodiments include a method of forming semiconductor regions of a device. A template is provided which comprises a first semiconductor material and having a polycrystalline region along a surface. The first semiconductor material comprises one or both of silicon and germanium. The polycrystalline region comprises polycrystalline first semiconductor material. Second semiconductor material is deposited along the surface under conditions which grow crystalline semiconductor structures from grains of the polycrystalline region. The crystalline semiconductor structures are doped to form a configuration having a first portion over a second portion, with the second portion being less heavily doped than the first portion.

Some embodiments include a method of forming a transistor. A template is provided to have a polycrystalline region along a surface. Semiconductor material is deposited along the surface under conditions which grow crystalline semiconductor structures from grains of the polycrystalline region. The semiconductor material comprises germanium. The crystalline semiconductor structures are doped to form a configuration having a first portion over a second portion, with the second portion being less heavily doped than the first portion. Insulative material is formed adjacent the second portion. A transistor gate is formed adjacent the second portion, and is spaced from the second portion by the insulative material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming crystalline semiconductor material, comprising:
    providing a template having a polycrystalline region along a surface;
    depositing semiconductor material along the surface under conditions which grow crystalline semiconductor material over the polycrystalline region, the depositing being conducted at a temperature of less than or equal to 500° C., and
    after the depositing, subjecting the crystalline semiconductor material to an anneal at a temperature greater than the temperature of the deposition and no greater than about 550° C., for a duration of at least about 1 second, the depositing and subjecting to the anneal forming the semiconductor material into semiconductor structures having a first region and a second region, the first and second regions having differing crystallinity relative to each other.

2. The method of claim 1 wherein the template comprises one or both of silicon and germanium, and is doped to a concentration of at least about $10^{21}$ atoms/cm$^3$ with conductivity-enhancing dopant.

3. The method of claim 2 wherein an oxide forms across the template surface, and further comprising removing the oxide prior to depositing the semiconductor material.

4. The method of claim 3 wherein the oxide removal and the depositing of the semiconductor material occur in a common chamber.

5. The method of claim 1 wherein the providing of the template comprises deposition of a material having the polycrystalline region.

6. The method of claim 1 wherein the providing of the template comprises growth of a material utilizing solid phase epitaxy.

7. The method of claim 1 wherein the template comprises germanium.

8. The method of claim 1 wherein the template comprises silicon.

9. The method of claim 1 wherein the template comprises silicon and germanium.

10. The method of claim 9 wherein the germanium is present to a concentration within a range of from about 5 atomic percent to about 95 atomic percent.

11. The method of claim 9 wherein the germanium is present to a concentration within a range of from about 5 atomic percent to about 50 atomic percent.

12. The method of claim 1 wherein the template comprises silicon and germanium, and is doped with phosphorus.

13. The method of claim 1 wherein the semiconductor material is a second semiconductor material, wherein the polycrystalline region of the template comprises a polycrystalline first semiconductor material; and wherein said polycrystalline first semiconductor material comprises an average grain size within a range of from about 5 nm to about 5 microns.

14. The method of claim 13 wherein the average grain size is within a range of from about 5 nm to about 10 nm.

15. The method of claim 13 wherein the average grain size is within a range of from about 1 micron to about 5 microns.

16. The method of claim 1 wherein the depositing utilizes one or more of ALD, CVD, PECVD, PVD and MBE.

17. The method of claim 1 wherein the depositing utilizes CVD with one or both of a silicon precursor and a germanium precursor; a temperature within a range of from about 250° C. to about 500° C., and a pressure within a range of from about 1 Torr to about 1 atmosphere.

18. The method of claim 17 wherein the temperature is a temperature of the as-deposited semiconductor material.

19. The method of claim 17 wherein the depositing utilizes the silicon precursor; with the silicon precursor being one or more of SiH, SiX and SiXH; where X represents halogen, and wherein the formulas indicate primary constituents rather than indicating specific stoichiometries.

20. The method of claim 17 wherein the depositing utilizes the germanium precursor; with the germanium precursor being one or more of GeH, GeX and GeXH; where X represents halogen, and wherein the formulas indicate primary constituents rather than indicating specific stoichiometries.

21. The method of claim 1 wherein the template surface comprises one or more amorphous regions proximate to the polycrystalline region; and wherein the depositing selectively grows crystalline semiconductor material from grains of the polycrystalline region relative to any growth of non-crystalline semiconductor material from said one or more amorphous regions.

22. The method of claim 21 wherein there is some growth of the non-crystalline semiconductor material from said one or more amorphous regions; and further comprising utilizing halogen-containing etchant to remove the non-crystalline semiconductor material from over said one or more amorphous regions, and growing the crystalline semiconductor material to extend laterally as well as upwardly, with the laterally-extending crystalline semiconductor material covering said one or more amorphous regions.

23. The method of claim 1 wherein the anneal increases crystallinity within the crystalline semiconductor material.

24. A method of forming semiconductor regions of a device, comprising:
providing a template comprising a first semiconductor material and having a polycrystalline region along a surface, the first semiconductor material comprising one or both of silicon and germanium; the polycrystalline region comprising polycrystalline first semiconductor material;
depositing second semiconductor material along the surface under conditions which grow crystalline semiconductor material from grains of the polycrystalline region, the depositing being conducted at a temperature of less than or equal to 500° C.;
after the depositing, subjecting the crystalline semiconductor material to an anneal at a temperature greater than the temperature of the deposition and no greater than about 550° C., for a duration of at least about 1 second, the depositing and subjecting to the anneal forming the semiconductor material into semiconductor structures having a first region and a second region, the first and second regions having differing crystallinity relative to each other; and
doping the crystalline semiconductor structures to form a configuration having a first portion over a second portion, with the second portion being less heavily doped than the first portion.

25. The method of claim 24 wherein the template surface comprises one or more amorphous regions proximate to the polycrystalline region; and wherein the depositing selectively grows the crystalline semiconductor material from grains of the polycrystalline region relative to any growth of non-crystalline semiconductor material from said one or more amorphous regions.

26. The method of claim 25 wherein there is some growth of the non-crystalline semiconductor material from said one or more amorphous regions; and further comprising utilizing halogen-containing etchant to remove the non-crystalline semiconductor material from over said one or more amorphous regions, and growing the crystalline semiconductor material to extend laterally as well as upwardly, with the laterally-extending crystalline semiconductor material covering said one or more amorphous regions.

27. The method of claim 24 wherein the template has a thickness and comprises the polycrystalline first semiconductor material throughout said thickness.

28. The method of claim 27 further comprising incorporating the configuration and the template into a transistor, with the first portion and the template comprising source/drain regions of the transistor, and with the second portion comprising a channel region of the transistor.

29. The method of claim 28 wherein the first semiconductor material comprises silicon.

30. The method of claim 28 wherein the first semiconductor material comprises germanium.

31. The method of claim 28 wherein the first semiconductor material comprises silicon and germanium.

32. The method of claim 24 wherein the doping forms the configuration to have a third portion under the second portion, with the third portion being more heavily doped than the second portion.

33. The method of claim 32 wherein the first portion and the third portion are doped to about a same level of doping as one another, and comprise a same type dopant as one another.

34. The method of claim 33 further comprising incorporating the configuration into a transistor, with the first and third portions comprising source/drain regions of the transistor, and with the second portion comprising a channel region of the transistor.

35. The method of claim 34 wherein the anneal is performed after the doping the crystalline semiconductor structures.

36. A method of forming a transistor, comprising:
providing a template having a polycrystalline region along a surface;
depositing semiconductor material along the surface under conditions which grow crystalline semiconductor structures from grains of the polycrystalline region, the semiconductor material comprising germanium, the crystalline semiconductor structures having a first region and a second region, the first and second regions having differing crystallinity relative to each other;
doping the crystalline semiconductor material to form a configuration having a first portion over a second portion, with the second portion being less heavily doped than the first portion;

forming insulative material adjacent the second portion; and forming a transistor gate adjacent the second portion, and spaced from the second portion by the insulative material.

37. The method of claim 36 wherein the depositing being conducted at a temperature of less than or equal to 500° C.

38. The method of claim 36 wherein the template surface comprises one or more amorphous regions proximate to the polycrystalline region; and wherein the depositing selectively grows crystalline semiconductor structures from grains of the polycrystalline region relative to any growth of non-crystalline semiconductor material from said one or more amorphous regions.

39. The method of claim 38 wherein there is some growth of the non-crystalline semiconductor material from said one or more amorphous regions; and further comprising utilizing halogen-containing etchant to remove the non-crystalline semiconductor material from over said one or more amorphous regions, and growing the crystalline semiconductor structures to extend laterally as well as upwardly, with the laterally-extending semiconductor structures covering said one or more amorphous regions.

40. The method of claim 36 further comprising, after the depositing, subjecting the crystalline semiconductor structures to an anneal at a temperature greater than the temperature of the deposition and no greater than about 550° C., for a duration of at least about 1 second.

41. The method of claim 36 wherein the semiconductor material is a second semiconductor material, and wherein the template comprises a first semiconductor material with the polycrystalline region comprising polycrystalline first semiconductor material; and wherein the template has a thickness and comprises the polycrystalline first semiconductor material throughout said thickness.

42. The method of claim 41 wherein the template and the first portion comprise source/drain regions of the transistor, and wherein the second portion comprises a channel region between the source/drain regions.

43. The method of claim 42 wherein the template comprises silicon.

44. The method of claim 42 wherein the template comprises germanium.

45. The method of claim 42 wherein the template comprises silicon and germanium.

46. The method of claim 36 wherein the doping forms the configuration to have a third portion under the second portion, with the third portion being more heavily doped than the second portion.

47. The method of claim 46 wherein the first and third portions comprise source/drain regions of the transistor, and wherein the second portion comprises a channel region between the source/drain regions.

* * * * *